(12) United States Patent
Xiao et al.

(10) Patent No.: US 12,349,333 B2
(45) Date of Patent: Jul. 1, 2025

(54) MANUFACTURING METHOD OF SEMICONDUCTOR STRUCTURE AND SEMICONDUCTOR STRUCTURE

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Deyuan Xiao, Hefei (CN); Yong Yu, Hefei (CN); Guangsu Shao, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 510 days.

(21) Appl. No.: 17/817,750

(22) Filed: Aug. 5, 2022

(65) Prior Publication Data
US 2023/0171941 A1    Jun. 1, 2023

(30) Foreign Application Priority Data
Nov. 30, 2021   (CN) .......................... 202111472785.9

(51) Int. Cl.
H10B 12/00        (2023.01)
(52) U.S. Cl.
CPC .......... *H10B 12/05* (2023.02); *H10B 12/315* (2023.02); *H10B 12/482* (2023.02)
(58) Field of Classification Search
None
See application file for complete search history.

(56) References Cited

U.S. PATENT DOCUMENTS 9,112,032 B1   8/2015   Liu et al.
9,318,576 B2   4/2016   Park
(Continued)

FOREIGN PATENT DOCUMENTS

CN   104425608 A   3/2015
CN   108389896 A   8/2018
(Continued)

OTHER PUBLICATIONS

First Office Action cited in CN202111444498.7 mailed May 16, 2022, 23 pages.
(Continued)

*Primary Examiner* — Steven M Page
(74) *Attorney, Agent, or Firm* — Kilpatrick Townsend & Stockton LLP

(57) ABSTRACT

The present disclosure provides a manufacturing method of a semiconductor structure and a semiconductor structure, and relates to the technical field of semiconductors. The manufacturing method of a semiconductor structure includes: providing a substrate; forming active pillars arranged at intervals on the substrate, the active pillar includes a first segment, a second segment, and a third segment that are connected sequentially along a first direction; forming a gate oxide layer on sidewalls of each of the second segment and the third segment; and forming a word line structure on a sidewall of the gate oxide layer, the word line structure includes a first word line structure and a second word line structure that are made of different materials, and the first word line structure is connected to the sidewall of the gate oxide layer, and partially covers the second word line structure.

12 Claims, 11 Drawing Sheets

(56) References Cited

U.S. PATENT DOCUMENTS

| | | | |
|---|---|---|---|
| 2006/0043472 A1 | 3/2006 | Wang et al. | |
| 2007/0082448 A1 | 4/2007 | Kim et al. | |
| 2011/0121396 A1 | 5/2011 | Lee | |
| 2017/0294439 A1* | 10/2017 | Kim | H10B 61/22 |
| 2021/0296316 A1 | 9/2021 | Zhu | |
| 2022/0115377 A1* | 4/2022 | Kim | H10B 12/053 |

FOREIGN PATENT DOCUMENTS

| | | | |
|---|---|---|---|
| CN | 108807545 A | 11/2018 | |
| CN | 109449158 A | 3/2019 | |
| CN | 109841522 A | 6/2019 | |
| CN | 109979880 A | 7/2019 | |
| CN | 113611671 A | 11/2021 | |

OTHER PUBLICATIONS

International Search Report cited in PCT/CN2022/077639 mailed May 19, 2022, 9 pages.
International Search Report cited in PCT/CN2022/077681 mailed Aug. 9, 2022, 8 pages.

\* cited by examiner

MANUFACTURING METHOD OF SEMICONDUCTOR STRUCTURE AND SEMICONDUCTOR STRUCTURE

CROSS-REFERENCE TO RELATED APPLICATION

This application claims the priority of Chinese Patent Application No. 202111472785.9, submitted to the Chinese Intellectual Property Office on Nov. 30, 2021, the disclosure of which is incorporated herein in its entirety by reference.

TECHNICAL FIELD

The present disclosure relates to the technical field of semiconductors, and in particular, to a manufacturing method of a semiconductor structure and a semiconductor structure.

BACKGROUND

A dynamic random access memory (DRAM) is a semiconductor memory that randomly writes and reads data at a high speed, and is widely used in data storage devices or apparatuses. The DRAM includes a plurality of memory cells disposed repeatedly, and each of the memory cells includes a transistor and a capacitor. The capacitor is connected to a source and a drain of the transistor through a capacitor contact region and a capacitor contact structure. As electronic products are increasingly becoming lighter, thinner, shorter, and smaller, components of the DRAM are also designed toward the trend of high integration, high density, and miniaturization.

With the development of semiconductor processes, a size of a semiconductor device is becoming smaller. Gate induced drain leakage (GIDL) imposes a great adverse impact on formation of a semiconductor structure, reducing performance and a yield of the semiconductor structure.

SUMMARY

A first aspect of the present disclosure provides a manufacturing method of a semiconductor structure, including
  providing a substrate;
  forming active pillars on the substrate, where the active pillars are arranged in an array, and the active pillar includes a first segment, a second segment, and a third segment that are connected sequentially along a first direction;
  forming a gate oxide layer on the second segment and the third segment; and
  forming a word line structure on a sidewall of the gate oxide layer, where the word line structure includes a first word line structure and a second word line structure that are connected sequentially along a first direction, the first word line structure is connected to the sidewall of the gate oxide layer, and partially covers the second word line structure, and the first word line structure and the second word line structure are made of different materials.

A second aspect of the present disclosure provides a semiconductor structure, including
  a substrate;
  a plurality of active pillars arranged as an array in the substrate, where the active pillar includes a first segment, a second segment, and a third segment that are connected sequentially along a first direction;
  a gate oxide layer, where the gate oxide layer covers sidewalls of each of the second segment and the third segment; and
  word line structures, where the word line structure includes a first word line structure and a second word line structure, the first word line structure is connected to a sidewall of the gate oxide layer, the first word line structure partially covers the second word line structure, and the first word line structure and the second word line structure are made of different materials.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may obtain other accompanying drawings based on these accompanying drawings without creative efforts.

DETAILED DESCRIPTION

Figure 1:
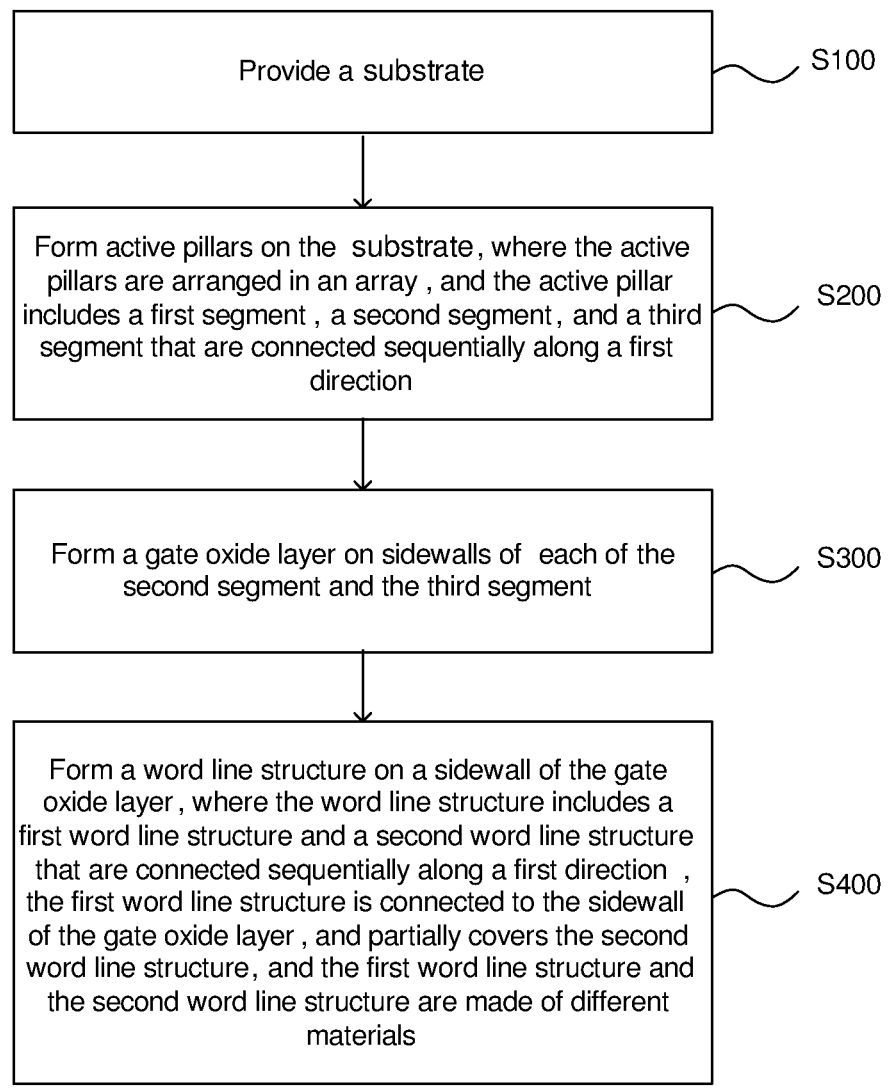
FIG. 1 is a flowchart of a manufacturing method of a semiconductor structure according to an exemplary embodiment.

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

A DRAM is a semiconductor memory that randomly writes and reads data at a high speed, and is widely used in data storage devices or apparatuses. The DRAM includes a plurality of memory cells disposed repeatedly, and each of the memory cells includes a transistor and a capacitor. The capacitor is connected to a source and a drain of the transistor through a capacitor contact region and a capacitor contact structure. As electronic products are increasingly becoming lighter, thinner, shorter, and smaller, components of the DRAM are also designed toward the trend of high integration, high density, and miniaturization.

In the related art, the transistor can be understood as a current switch structure made of a semiconductor material. A metal gate is disposed between the source and the drain of the transistor, and the metal gate can be used to control on/off of a current between the source and the drain. A gate-all-around (GAA) transistor is made by using a GAA technology. With the development of semiconductor processes, a size of a semiconductor device is becoming smaller. In addition, GIDL occurs in a process of forming a structure of the GAA transistor, reducing performance and a yield of the semiconductor structure.

In the manufacturing method of a semiconductor structure and a semiconductor structure provided by the embodiments of the present disclosure, the gate oxide layer is formed on the second segment and the third segment of the active pillar. The word structure is formed on the sidewall of the gate oxide layer and includes the first word line structure and the second word line structure, which are made of different materials. Therefore, when the semiconductor structure is used, the first word line structure and the second word line structure have different potentials, which is beneficial to controlling the turn-off current of the semiconductor structure, and reducing the problems of GIDL and inter-band tunneling, thereby effectively improving the performance and yield of the semiconductor structure.

Exemplary embodiments of the present disclosure provide a manufacturing method of a semiconductor structure. The following describes the manufacturing method of a semiconductor structure with reference to FIGS. 1 to 35.

There are no limits made on the semiconductor structure in the embodiments. The semiconductor structure is described below by using a DRAM as an example, but is not limited thereto in the embodiments. Alternatively, the semiconductor structure in the embodiments may be another structure, for example, a GAA transistor or a vertical gate-all-around (VGAA) transistor.

As shown in FIG. 1, an exemplary embodiment of the present disclosure provides a manufacturing method of a semiconductor structure, including the following steps:

Step S100: Provide a substrate.

Step S200: Form active pillars on the substrate, where the active pillars are arranged in an array, and the active pillar includes a first segment, a second segment, and a third segment that are connected sequentially along a first direction.

Step S300: Form a gate oxide layer on sidewalls of each of the second segment and the third segment.

Step S400: Form a word line structure on a sidewall of the gate oxide layer, where the word line structure includes a first word line structure and a second word line structure that are connected sequentially along a first direction, the first word line structure is connected to the sidewall of the gate oxide layer, and partially covers the second word line structure, and the first word line structure and the second word line structure are made of different materials.

According to an exemplary embodiment, this embodiment is a further description of step S100. The manufacturing method of a semiconductor structure in this embodiment includes the following content.

Figure 2:
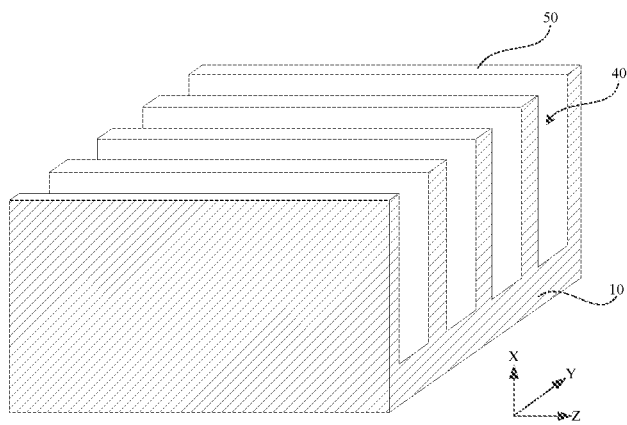
FIG. 2 is a schematic diagram of forming a strip body in the manufacturing method of a semiconductor structure according to an exemplary embodiment.

As shown in FIG. 2, the substrate 10 is provided. The substrate 10 serves as a support member of a DRAM and is configured to support other components provided thereon. The substrate 10 may be made of a semiconductor material. The semiconductor material may be one or more of silicon, germanium, a silicon-germanium compound, and a silicon-carbon compound. In this embodiment, the substrate 10 is made of silicon, to facilitate understanding of a subsequent forming method by those skilled in the art, rather than to constitute a limitation. In an actual application process, a proper material of the substrate may be selected as required.

According to an exemplary embodiment, this embodiment is a further description of step S200.

Figure 4:
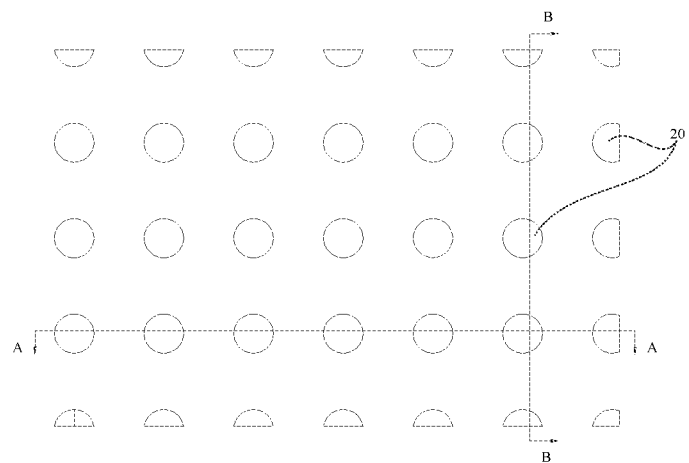
FIG. 4 is a top view of forming an active pillar in the manufacturing method of a semiconductor structure according to an exemplary embodiment.

As shown in FIG. 4, the active pillars 20 are formed on the substrate 10. The plurality of active pillars 20 are provided and arranged as the array on the substrate 10. In other words, the plurality of active pillars 20 may be arranged in a plurality of rows and a plurality of columns. Along the first direction X, the active pillar 20 includes the first segment 201, the second segment 202, and the third segment 203 that are sequentially connected. The first segment 201 is connected to the substrate 10. With reference to FIG. 1, using an orientation shown in the figure as an example, the first direction X is an extension direction from a bottom surface of the substrate 10 to a top surface of the substrate 10.

In some embodiments, the active pillars 20 arranged as the array may be formed on the substrate 10 by using the following method.

Figure 3:
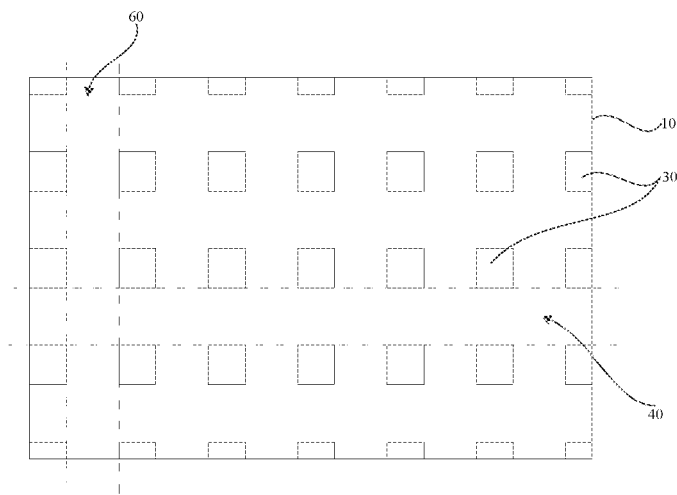
FIG. 3 is a top view of forming a silicon pillar in the manufacturing method of a semiconductor structure according to an exemplary embodiment.

First, with reference to FIG. 3, the plurality of silicon pillars 30 are formed on the substrate 10 and are arranged in an array. With a plane parallel to the first direction X as a cross section, a cross-sectional shape of the silicon pillar 30 includes a square. In some embodiments, the silicon pillar 30 may be formed on the top surface of the substrate 10 by using a silicon epitaxial growth process, or by depositing a plurality of functional layers on the top surface of the substrate 10, and some of the functional layers are removed through etching, such that the silicon pillars 30 arranged in the plurality of rows and plurality of columns are formed on the substrate 10.

Then, the silicon pillar 30 is preprocessed to form the active pillar 20, where the cross-sectional shape of the active pillar 20 includes a circle and/or an ellipse. In some embodiments, the preset processing includes oxidation processing. Edges and corners of the silicon pillar 30 are passivated through the oxidation processing, such that the cross-sectional shape of the silicon pillar 30 changes from the square to a circle or an ellipse. In this embodiment, the edges and the corners of the silicon pillar 30 are passivated through the oxidation processing, which can improve an adhesion capability of the active pillar 20, such that the subsequently formed functional layers such as a dielectric layer, a word line, and a bit line can be well connected to the active pillar 20, thereby improving performance and a yield of the semiconductor structure.

It should be noted that the oxidation processing includes thermal oxidation or steam oxidation. In the oxidation processing, the silicon pillar 30 is exposed to the outside. Through thermal oxidation or steam oxidation, an oxide layer, such as silicon oxide, is formed on a surface of the silicon pillar 30, and then can be removed through etching, thereby removing a part of the silicon pillar 30, to passivate the edges and the corners of the silicon pillar 30.

In this embodiment, before the silicon pillar 30 is oxidized, ions may be implanted into it. As an example, the method of processing the silicon pillar 30 by using the ion implantation process, to form a drain and a source of the subsequently formed active pillar 20 is known to those skilled in the art, and details are not described herein again.

It should be noted that, after the ions are implanted into the silicon pillar 30, and it is oxidized, the first segment 201 of the active pillar 20 can form a drain, and the second segment 202 may form a channel region, the third segment 203 can form a source.

With reference to FIGS. 2 and 3, in some embodiments, the silicon pillars 30 may be formed on the substrate 10 by using the following method.

At first, a plurality of bit line isolation trenches 40 are formed in the substrate 10, and disposed at intervals along a second direction Y. With reference to FIG. 2, using an orientation shown in the figure as an example, the second direction Y is an extension direction perpendicular to a front side surface of the substrate 10. The substrate 10 between adjacent ones of the bit line isolation trenches 40 forms a strip body 50.

In a process of forming the bit line isolation trench 40 on the substrate 10, a mask layer with a mask pattern can be first formed on the substrate 10, and along an extension direction from the top surface of the substrate 10 to the bottom surface of the substrate 10, a part of the substrate 10 is removed based on the mask pattern to form the plurality of bit line isolation trenches 40 disposed at intervals along the second direction Y.

Then, a plurality of word line isolation trenches 60 are formed in the substrate 10. The plurality of word line isolation trenches 60 are disposed at intervals along a third direction Z. The strip body 50 is divided into the plurality of silicon pillars 30 by the word line isolation trenches 60 disposed along the third direction Z. In this embodiment, along the first direction X, the word line isolation trench 60 is shallower the bit line isolation trench 40.

With reference to FIG. 2, using an orientation shown in the figure as an example, the third direction Z is an extension direction parallel to a front side face of the substrate 10. The second direction Y intersects the third direction Z on a same horizontal plane, where the second direction Y may intersect the third direction Z at a predetermined angle. For example, the second direction Y is perpendicular to the third direction Z.

In a process of forming the word line isolation trench 60 on the substrate 10, a mask layer with a mask pattern may be first formed on the substrate 10. Along an extension direction from the top surface of the substrate 10 to the bottom surface of the substrate 10, a part of the substrate 10 is removed based on the mask pattern, to form the plurality of word line isolation trenches 60 disposed at intervals along the third direction Z.

Figure 5:
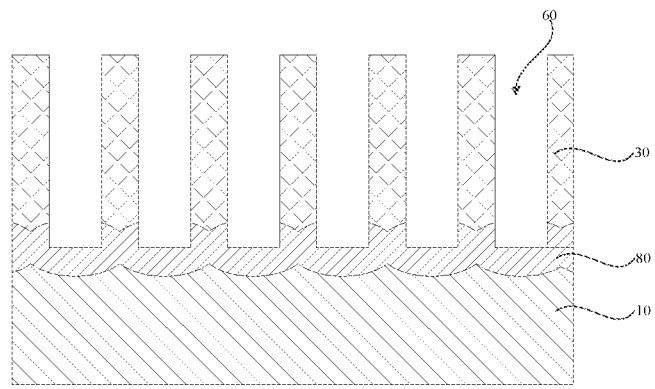
FIG. 5 is a sectional view of forming a bit line and a first isolation layer along a direction A-A in FIG. 4.
Figure 6:
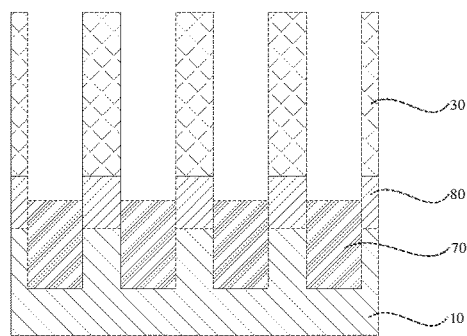
FIG. 6 is a sectional view of forming the bit line and the first isolation layer along a direction B-B in FIG. 4.
Figure 7:
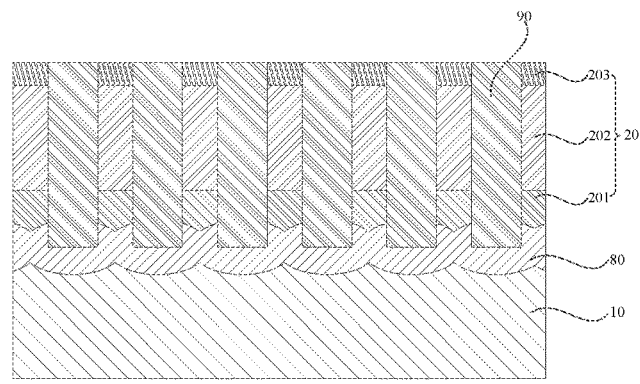
FIG. 7 is a schematic diagram of forming the active pillar and a second initial isolation layer along a direction Z in the manufacturing method of a semiconductor structure according to an exemplary embodiment.
Figure 8:
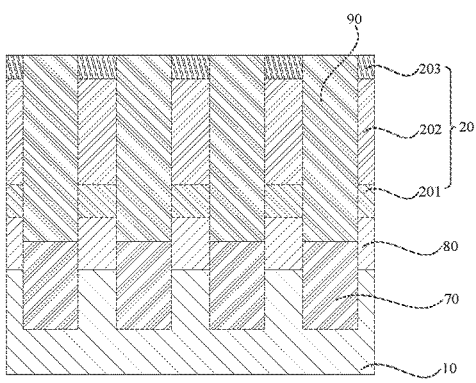
FIG. 8 is a schematic diagram of forming the active pillar and the second initial isolation layer along a direction Y in the manufacturing method of a semiconductor structure according to an exemplary embodiment.
Figure 9:
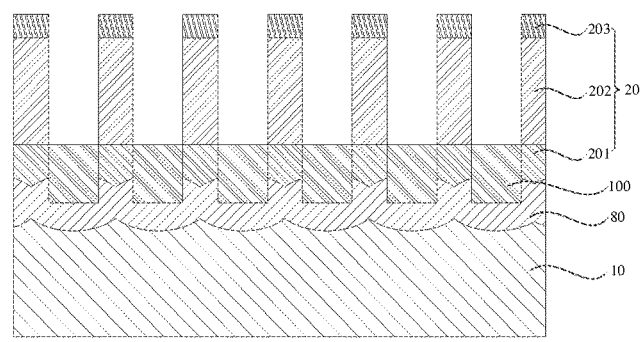
FIG. 9 is a schematic diagram of forming a second isolation layer along the direction Z in the manufacturing method of a semiconductor structure according to an exemplary embodiment.
Figure 10:
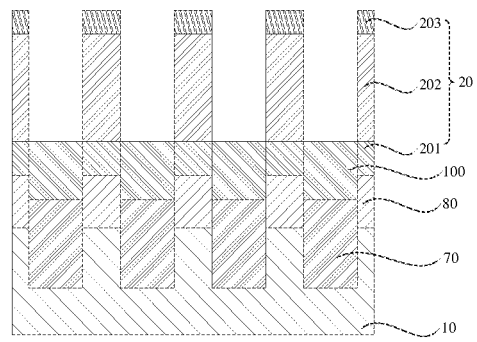
FIG. 10 is a schematic diagram of forming the second isolation layer along the direction Y in the manufacturing method of a semiconductor structure according to an exemplary embodiment.

As shown in FIGS. 5 and 6, in some embodiments, after the formation of the bit line isolation trenches 40 and the word line isolation trenches 60, a first initial isolation layer may be formed in the bit line isolation trench 40 and the word line isolation trench 60 by using the atomic layer deposition process, a physical vapor deposition process, or a chemical vapor deposition process. The top surface of the first initial isolation layer is flush with that of the silicon pillar 30. Then, along the extension direction from the top surface of the substrate 10 to the bottom surface of the substrate 10, the first initial isolation layer is etched and removed partially. The etching endpoint of the first initial isolation layer is located on the bottom surface of the word line isolation trench 60. The retained first initial isolation layer forms a first isolation layer 70, that is, the top surface of the first isolation layer 70 is flush with a bottom surface of the word line isolation trench 60. The material of the first isolation layer 70 includes, but is not limited to, silicon nitride, silicon dioxide, or silicon oxynitride.

Then, an ion implantation process is performed in the word line isolation trench 60 to form a bit line 80 on the bottom surface of the first segment 201. In some embodiments, cobalt (Co), a nickel platinum (NiPt) alloy, or the like may be implanted into the bottom of the word line isolation trench 60 by using the ion implantation process, and the Co or NiPt alloy reacts with the substrate 10 to form cobalt silicide (CoSi) or platinum nickel silicide (PtNiSi). After annealing, the CoSi or PtNiSi diffuses to a bottom surface of the active pillar 20 in the substrate 10 to form a bit line 80. The bit line 80 may be connected to first segments 201 of a plurality of subsequently formed active pillars 20 that are along the third direction Z and in a same straight line.

The bit line forming method in this embodiment is simple and easy to control and operate. It should be noted that the bit line may be connected to a drain of the subsequently formed active pillar 20. In a transistor, a gate is connected to a word line, and a source is connected to a capacitor structure. A voltage signal on the word line can control the transistor to turn on or off, and then data information stored in the capacitor structure is read through the bit line, or data information is written into the capacitor structure through the bit line for storage.

After the bit line 80 is formed, as shown in FIGS. 7 to 10, a second initial isolation layer 90 may be formed on the first isolation layer 70 by using the atomic layer deposition process, the physical vapor deposition process, or the chemical vapor deposition process.

Along the first direction X (the direction shown in FIG. 2), the second initial isolation layer 90 is partially removed through etching. The retained second initial isolation layer 90 forms a second isolation layer 100. A material of the second isolation layer 100 includes, but is not limited to, silicon nitride, silicon dioxide, or silicon oxynitride. The first isolation layer 70 and the second isolation layer 100 may be made of a same material or different materials. In some embodiments, the second isolation layer 100 and the first isolation layer 70 are made of a same material, to shorten the deposition process of the bit line isolation layer 110.

Figure 14:
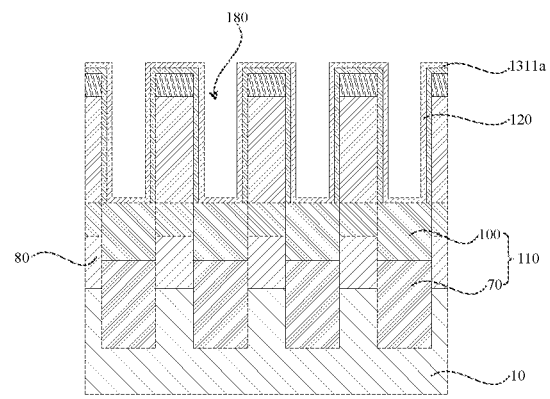
FIG. 14 is a schematic diagram of forming the first initial word line along the direction Y in the manufacturing method of a semiconductor structure according to an exemplary embodiment.
Figure 15:
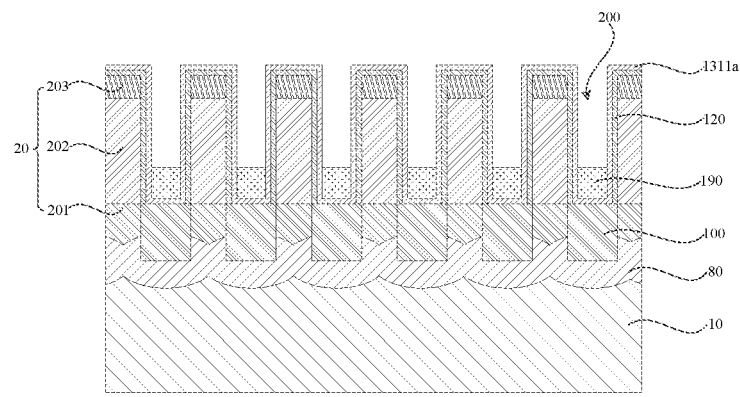
FIG. 15 is a schematic diagram of forming a first sacrificial layer along the direction Z in the manufacturing method of a semiconductor structure according to an exemplary embodiment.
Figure 16:
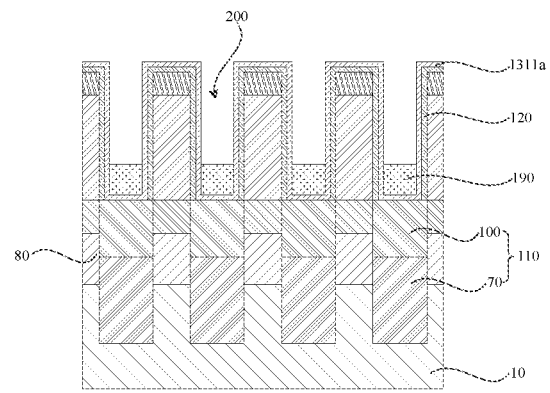
FIG. 16 is a schematic diagram of forming the first sacrificial layer along the direction Y in the manufacturing method of a semiconductor structure according to an exemplary embodiment.
Figure 17:
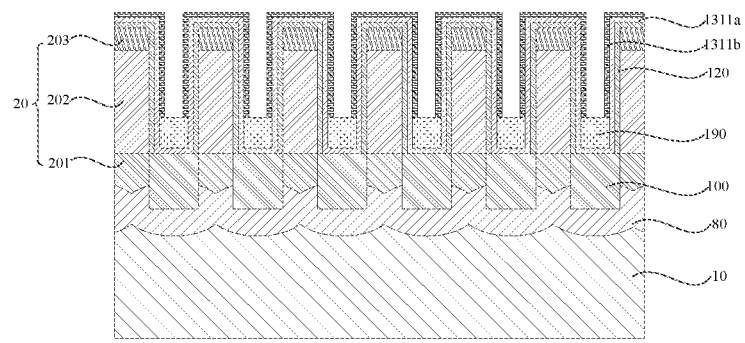
FIG. 17 is a schematic diagram of forming a second initial word line along the direction Z in the manufacturing method of a semiconductor structure according to an exemplary embodiment.
Figure 18:
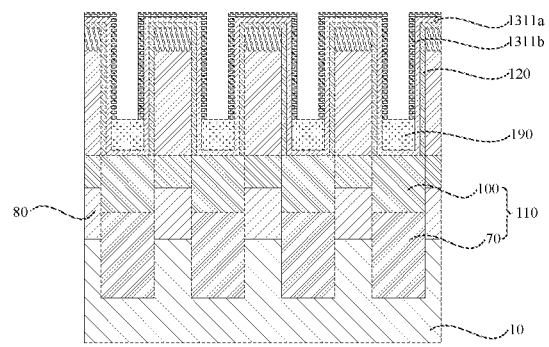
FIG. 18 is a schematic diagram of forming the second initial word line along the direction Y in the manufacturing method of a semiconductor structure according to an exemplary embodiment.

As shown in FIG. 14, the first isolation layer 70 and the second isolation layer 100 form a bit line isolation structure 110. The bit line isolation structure 110 is configured to insulates adjacent bit lines 80 subsequently formed in the substrate 10.

According to an exemplary embodiment, this embodiment is a further description of step S300. The manufacturing method of a semiconductor structure in this embodiment includes the following content.

Figure 13:
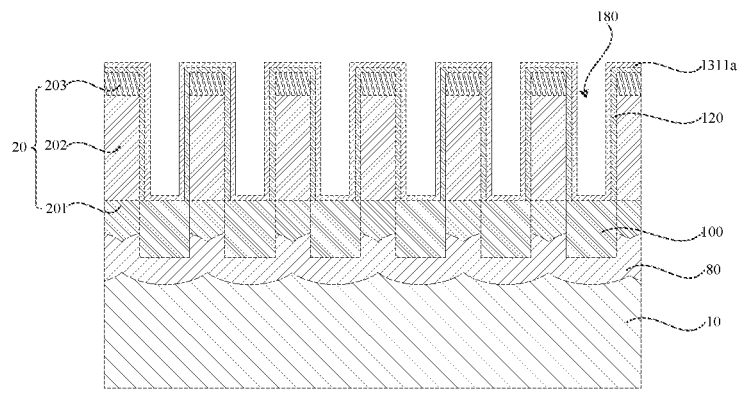
FIG. 13 is a schematic diagram of forming a first initial word line along the direction Z in the manufacturing method of a semiconductor structure according to an exemplary embodiment.

As shown in FIGS. 13 and 14, a gate oxide layer 120 is formed on the second segment 202 and the third segment 203 of the active pillar 20.

After the bit line isolation structure 110 is formed in the foregoing step, the gate oxide layer 120 is formed on the sidewall of the second segment 202 and on the sidewall and the top surface of the third segment 203 of the active pillar 20 by using the atomic layer deposition process. The atomic layer deposition process is characterized by a low deposition rate, high density of a deposited film layer, and good step coverage. The gate oxide layer 120 formed by using the atomic layer deposition process can effectively isolate and protect the second segment, namely, the gate of the active pillar when the gate oxide layer is relatively thin, and can avoid occupying large space, thereby facilitating subsequent filling or formation of another structure layer. A material of the gate oxide layer 120 may include, but is not limited to, silicon dioxide, silicon monoxide, hafnium oxide, or titanium oxide.

According to an exemplary embodiment, this embodiment is a further description of step S400. The manufacturing method of a semiconductor structure in this embodiment includes the following content.

As shown in FIGS. 30 to 33, the word line structure 130 is formed on a sidewall of the gate oxide layer 120. The word line structure 130 includes a first word line structure 1310 and a second word line structure 1320 that are sequentially connected along the first direction. The first word line structure 1310 is connected to the sidewall of the gate oxide layer 120, and the first word line structure 1310 partially covers the second word line structure 1320.

The word line structure 130 may be formed by using the following method.

Figure 11:
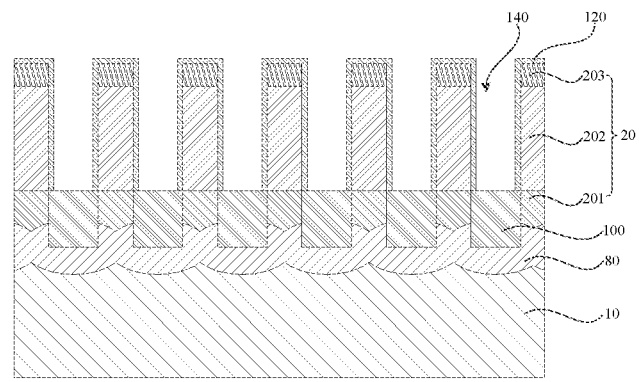
FIG. 11 is a schematic diagram of forming a gate oxide layer along the direction Z in the manufacturing method of a semiconductor structure according to an exemplary embodiment.
Figure 12:
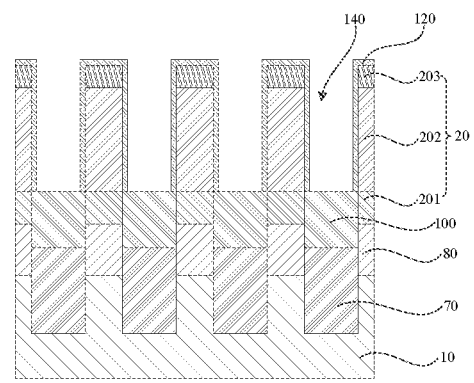
FIG. 12 is a schematic diagram of forming the gate oxide layer along the direction Y in the manufacturing method of a semiconductor structure according to an exemplary embodiment.

With reference to FIGS. 11 and 12, after the gate oxide layer 120 is formed, a first filling region 140 is formed between the top surface of the second isolation layer 100 and the sidewall of the gate oxide layer 120.

Figure 19:
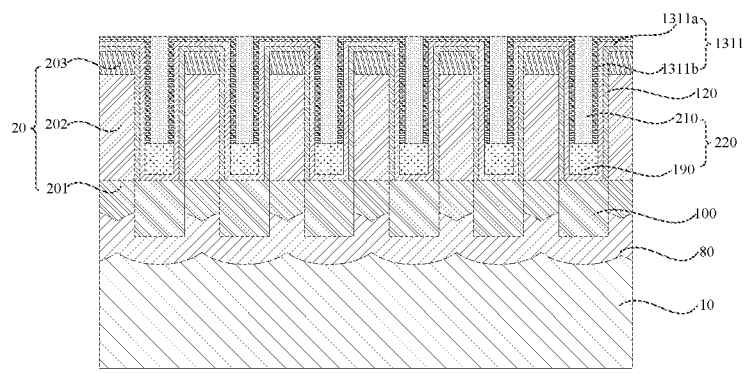
FIG. 19 is a schematic diagram of forming a second sacrificial layer and a first initial word line structure along the direction Z in the manufacturing method of a semiconductor structure according to an exemplary embodiment.
Figure 20:
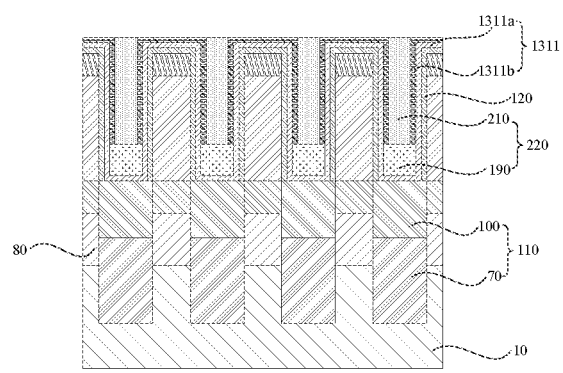
FIG. 20 is a schematic diagram of forming the second sacrificial layer and the first initial word line structure along the direction Y in the manufacturing method of a semiconductor structure according to an exemplary embodiment.

A first initial word line structure 1311 is formed in the first filling region 140 by using the atomic layer deposition process. As shown in FIGS. 19 and 20, the first initial word line structure 1311 is formed on the sidewall and the top surface of the gate oxide layer 120.

Then, the first initial word line structures 1311 are cut off along the second direction Y. The retained first initial word line structures 1311 form a plurality of first transition word line structures 1312 arranged at intervals along the second direction Y.

Figure 21:
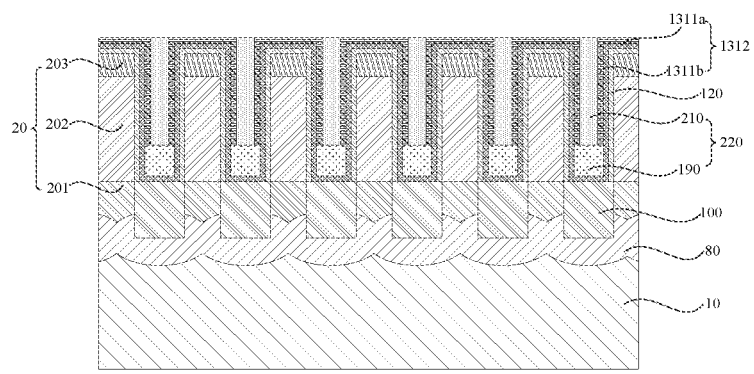
FIG. 21 is a schematic diagram of forming a first transition word line structure along the direction Z in the manufacturing method of a semiconductor structure according to an exemplary embodiment.
Figure 22:
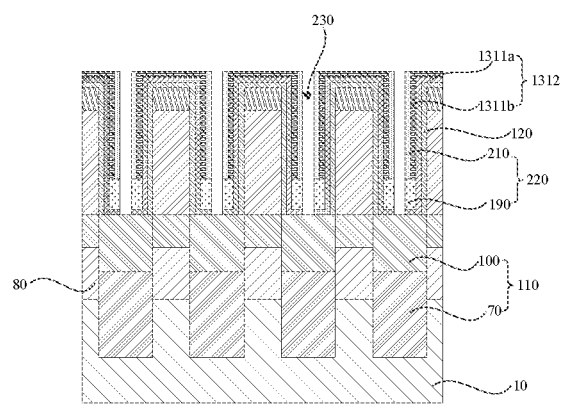
FIG. 22 is a schematic diagram of forming the first transition word line structure along the direction Y in the manufacturing method of a semiconductor structure according to an exemplary embodiment.
Figure 23:
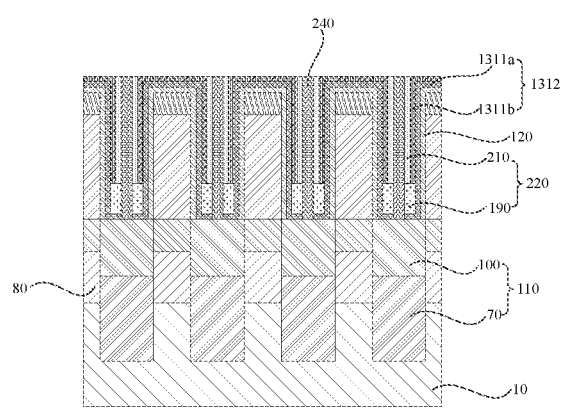
FIG. 23 is a schematic diagram of forming a third sacrificial layer along the direction Y in the manufacturing method of a semiconductor structure according to an exemplary embodiment.

With reference to FIGS. 21 to 23, in some embodiments, along the second direction Y (the direction shown in FIG. 2), the first initial word line structure 1311 may be removed partially through etching. The etching endpoint of the first initial word line structure 1311 is located on the top surface of the second isolation layer 100, such that the first initial word line structure 1311 is cut off.

Figure 24:
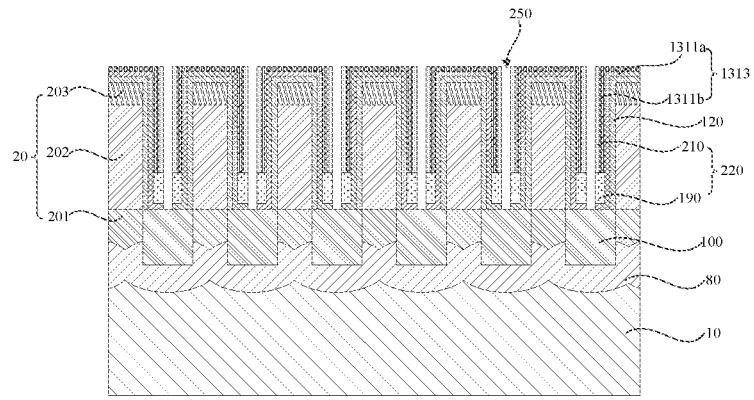
FIG. 24 is a schematic diagram of forming a first intermediate word line structure and a second trench along the direction Z in the manufacturing method of a semiconductor structure according to an exemplary embodiment.
Figure 25:
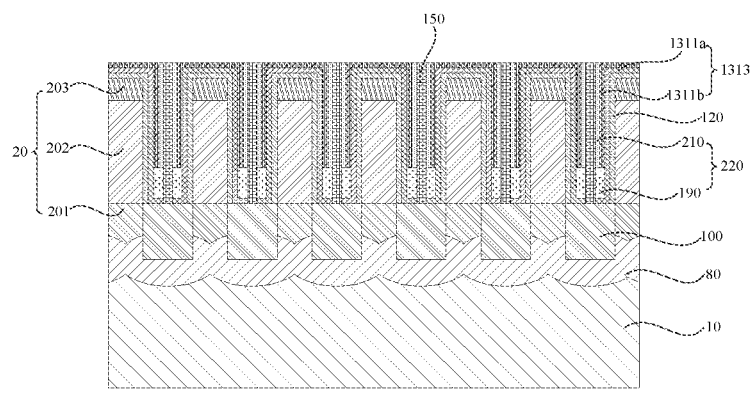
FIG. 25 is a schematic diagram of forming a word line isolation structure along the direction Z in the manufacturing method of a semiconductor structure according to an exemplary embodiment.
Figure 26:
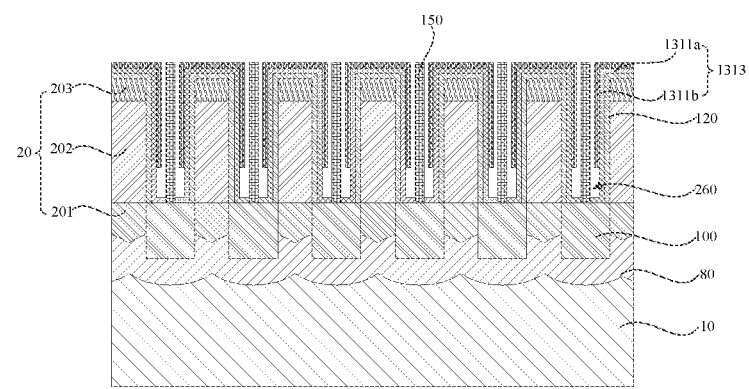
FIG. 26 is a schematic diagram of forming a third trench along the direction Z in the manufacturing method of a semiconductor structure according to an exemplary embodiment.
Figure 27:
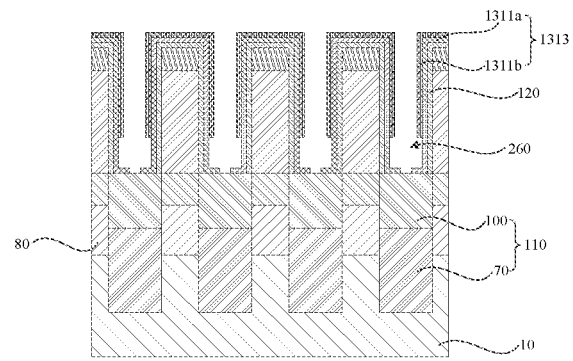
FIG. 27 is a schematic diagram of forming the third trench along the direction Y in the manufacturing method of a semiconductor structure according to an exemplary embodiment.
Figure 28:
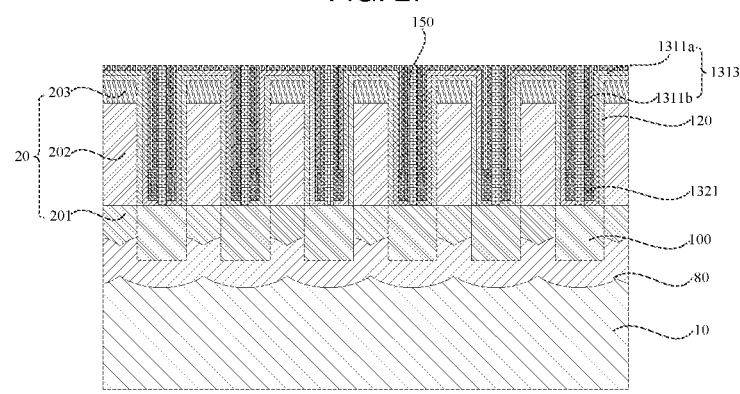
FIG. 28 is a schematic diagram of forming a second initial word line structure along the direction Z in the manufacturing method of a semiconductor structure according to an exemplary embodiment.

Then, along the third direction Z (the direction shown in FIG. 2), the first initial word line structure 1311 is removed partially through etching, to cut off the first transition word line structure 1312. Then, as shown in FIGS. 24 and 25, a word line isolation structure 150 is formed between adjacent first transition word line structures 1312 by using the atomic layer deposition process, the physical vapor deposition process or the chemical vapor deposition process. In this step, the first transition word line structures 1312 are cut off by using the plurality of word line isolation structures 150 arranged at intervals along the third direction Z, thereby forming first intermediate word line structures 1313 arranged in an array. The word line isolation structure 150 can insulate adjacent word line structures 130 subsequently formed in the substrate 10, and ensure the performance and the yield of the semiconductor structure.

Figure 29:
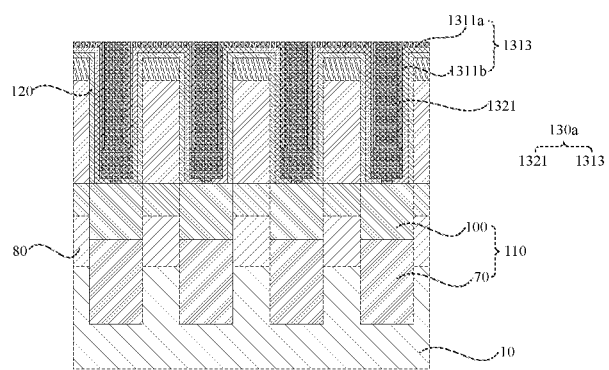
FIG. 29 is a schematic diagram of forming the second initial word line structure along the direction Y in the manufacturing method of a semiconductor structure according to an exemplary embodiment.

As shown in FIG. 29, a second initial word line structure 1321 is formed between the first intermediate word line structure 1313 and the word line isolation structure 150 through the atomic layer deposition process, the physical vapor deposition process, or the chemical vapor deposition process. The first intermediate word line structure 1313 and the second initial word line structure 1321 form the initial word line structure 130a.

Figure 30:
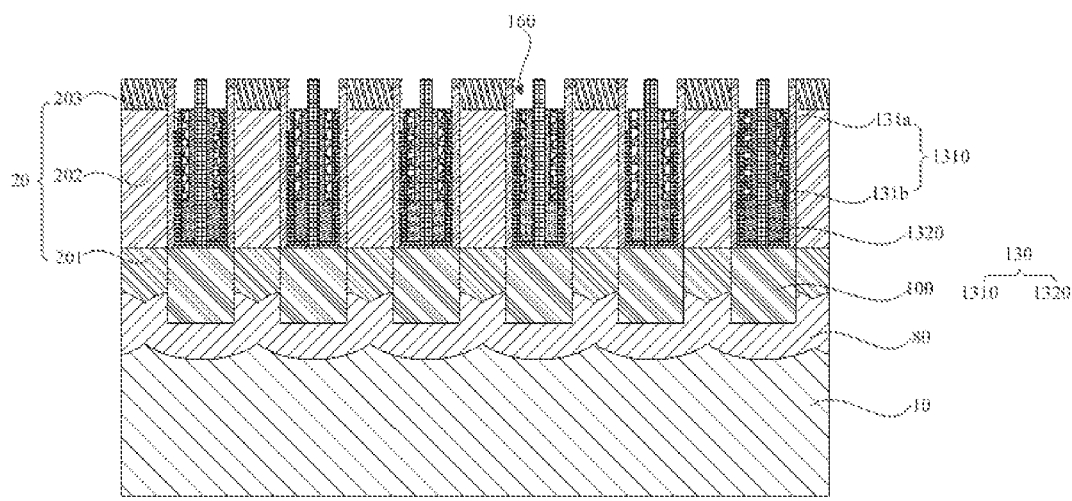
FIG. 30 is a schematic diagram of forming a second filling region along the direction Z in the manufacturing method of a semiconductor structure according to an exemplary embodiment.
Figure 31:
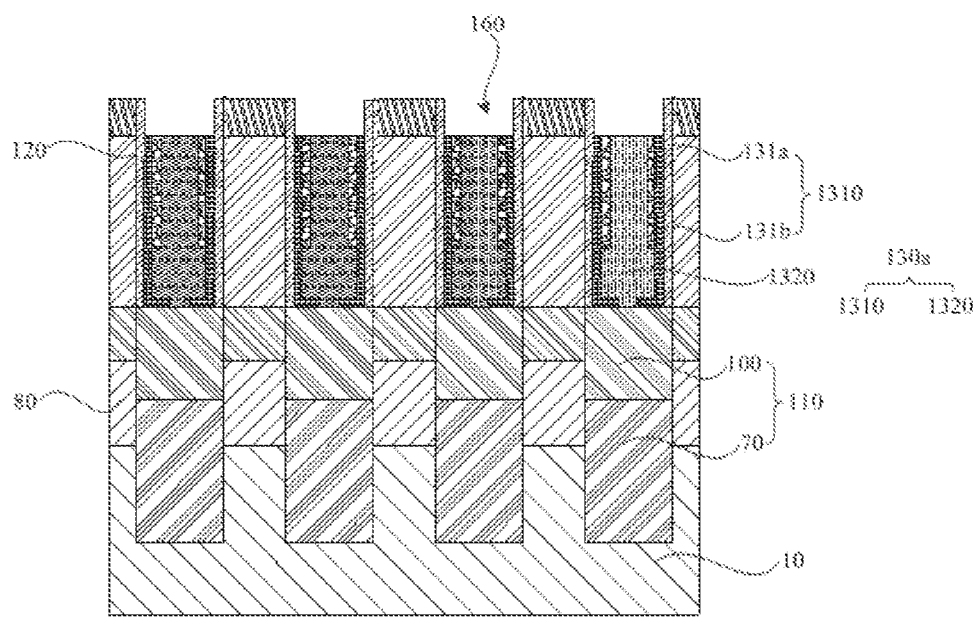
FIG. 31 is a schematic diagram of forming the second filling region along the direction Y in the manufacturing method of a semiconductor structure according to an exemplary embodiment.

Along the extension direction from the top surface of the substrate 10 to the bottom surface of the substrate 10, the initial word line structure 130a is removed partially through etching, to partially expose the sidewall of the gate oxide layer 120. The retained initial word line structure 130a includes the first word line structure 1310 and the second word line structure 1320, and the first word line structure 1310 and the second word line structure 1320 form the word line structure 130. With reference to FIGS. 30 and 31, the top surface of the word line structure 130 and the exposed sidewall of the gate oxide layer 120 form a second filling region 160.

Figure 32:
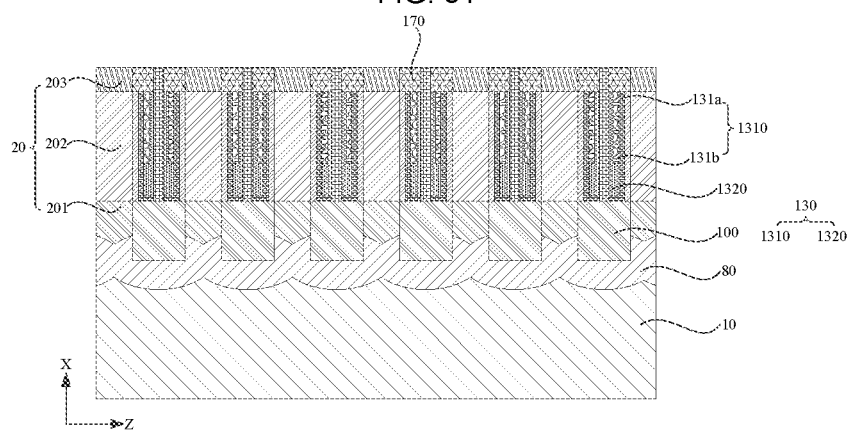
FIG. 32 is a schematic diagram of forming a third isolation layer along the direction Z in the manufacturing method of a semiconductor structure according to an exemplary embodiment.
Figure 33:
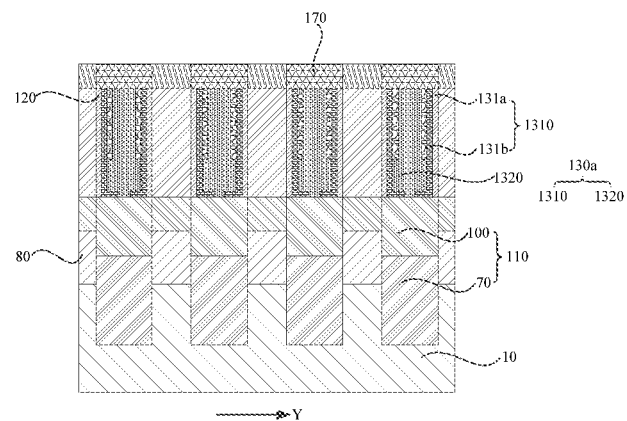
FIG. 33 is a schematic diagram of forming the third isolation layer along the direction Y in the manufacturing method of a semiconductor structure according to an exemplary embodiment.

As shown in FIGS. 32 and 33, the third isolation layer 170 is formed in the second filling region 160 by using the atomic layer deposition process, the physical vapor deposition process, or the chemical vapor deposition process. The top surface of the third isolation layer 170 is flush with that of the gate oxide layer 120. A material of the third isolation layer 170 includes, but is not limited to, silicon nitride, silicon dioxide, or silicon oxynitride.

Finally, the top surface of the third isolation layer 170 is processed to expose the top surface of the active pillar 20. In some embodiments, the top surface of the third isolation layer 170 may be processed through chemical mechanical polishing, such that the top surface of the retained third isolation layer 170 is flush with that of the active pillar 20.

The method for forming the word line structure 130 in this embodiment is simple and easy to control. During the process of forming the word line structure 130, the formation quality of the first word line structure 1310 and the second word line structure 1320 can be precisely controlled, thereby effectively ensuring the performance and yield of semiconductor structure.

As shown in FIGS. 13 to 20, in some embodiments, this embodiment is a further description of the above steps of forming the first initial word line structure 1311 in the first filling region 140. In this embodiment, the method includes the following content.

First, a first initial word line 1311a is formed in the first filling region 140 by using the atomic layer deposition process, the physical vapor deposition process, or the chemical vapor deposition process. The first initial word line 1311a extends outside the first filling region 140 and covers the top surface of the active pillar 20. In this case, a first filling sub-region 180 is formed between the first initial word lines 1311a.

In an embodiment, the first initial word line 1311a may be formed in the first filling region 140 through deposition, and the first initial word line 1311a fills up the entire first filling region 140 and covers the top surface of the active pillar 20. Then, along the extension direction from the top surface of the substrate 10 to the bottom surface of the substrate 10, the first initial word line 1311a is partially removed through etching, and the first initial word line 1311a on the sidewall of the first filling region 140 is retained. It should be understood that the etching endpoint of the first initial word line 1311a may be located between one third and two thirds of the height of the second segment 202. In a specific embodiment, the etching endpoint of the first initial word line 1311a may be located at a half height of the second segment 202.

Then, a first sacrificial layer 190 is formed in the first filling sub-region 180 by using the atomic layer deposition process, the physical vapor deposition process or the chemical vapor deposition process. A second filling sub-region 200 is formed between the top surface of the first sacrificial layer 190 and the sidewall of the first initial word line 1311a. A material of the first sacrificial layer 190 includes, but is not limited to, silicon nitride, silicon dioxide, or silicon oxynitride.

Then, a second initial word line 1311b is formed in the second filling sub-region 200 through the atomic layer deposition process, the physical vapor deposition process, or the chemical vapor deposition process. The second initial word line 1311b extends outside the second filling sub-region 200 and covers the top surface of the first initial word line 1311a.

In an embodiment, the second initial word line 1311b may be deposited in the second filling sub-region 200 first, and the second initial word line 1311b fills up the second filling sub-region 200. Then, the second initial word line 1311b is partially removed along the extension direction from the top surface of the substrate 10 to the bottom surface of the substrate 10, and the etching endpoint of the second initial word line 1311b is located on the top surface of the first sacrificial layer 190. The second initial word line 1311b on the sidewall of the first initial word line 1311a is retained.

Finally, a second sacrificial layer 210 is formed on the first sacrificial layer 190 by using the atomic layer deposition process, the physical vapor deposition process or the chemical vapor deposition process. The top surface of the second sacrificial layer 210 is flush with that of the second initial word line 1311*b*. The second sacrificial layer 210 and the first sacrificial layer 190 form an initial sacrificial layer 220.

A material of the second sacrificial layer 210 includes, but is not limited to, silicon nitride, silicon dioxide, or silicon oxynitride. In some embodiments, the first sacrificial layer 190 and the second sacrificial layer 210 may be made of a same material or different materials.

It should be noted that, with reference to FIGS. 29 to 33, in the foregoing step in which the initial word line structure 130*a* is partially removed through etching, to partially expose the sidewall of the gate oxide layer 120, and the retained initial word line structure 130*a* forms the word line structure 130, the first initial word line 1311*a* and the second initial word line 1311*b* are partially removed through etching, the retained first initial word line 1311*a* forms a first word line 131*a*, and the retained second initial word line 1311*b* forms a second word line 131*b*.

The first word line 131*a* and the second word line 131*b* form a first word line structure 1310. The material of the first word line 131*a* includes, but is not limited to, titanium nitride. The material of the second word line 131*b* includes, but is not limited to, titanium nitride. In some embodiments, the first word line 131*a* and the second word line 131*b* are both made of titanium nitride. In this embodiment, the thickness of the first word line structure 1310 made of titanium nitride material affects the potential when the semiconductor structure is used subsequently. The material of the first word line 131*a* and the second word line 131*b* is different from that of the second word line structure 1320, such that during the use of the semiconductor structure, the first word line structure 1310 and the second word line structure 1320 generate different potentials, which is beneficial to controlling the turn-off current of the semiconductor structure, and reducing the problems of GIDL and inter-band tunneling, thereby effectively improving the performance and yield of the semiconductor structure.

As shown in FIGS. 22 and 23, in some embodiments, this embodiment is a further description of the foregoing step of cutting off the first initial word line structure 1311 along the second direction Y. In this embodiment, the method includes the following content.

Along the second direction Y, the initial sacrificial layers 220 and the first initial word line structures 1311 are removed partially through etching to form a plurality of first trenches 230 arranged at intervals along the second direction Y. The bottom surface of the first trench 230 exposes the top surface of the second isolation layer 100. The retained first initial word line structure 1311 forms a first transition word line structure 1312.

With reference to FIG. 23, a third sacrificial layer 240 is formed in the first trench 230 by using the atomic layer deposition process, the physical vapor deposition process, or the chemical vapor deposition process. A material of the third sacrificial layer 240 includes, but is not limited to, silicon nitride, silicon dioxide, or silicon oxynitride. The third sacrificial layer 240 is configured to cut off the first initial word line structure 1311, such that adjacent word line structures 130 formed subsequently are arranged at intervals.

In a specific embodiment, the third sacrificial layer 240, the first isolation layer 70, the second isolation layer 100, and the third isolation layer 170 are all made of a same material, to shorten the manufacturing process of the semiconductor structure.

As shown in FIGS. 24 and 25, in an embodiment, this embodiment is a further description of the foregoing step of partially removing the first initial word line structure 1311 through etching along the third direction Z to cut off the first transition word line structure 1312. The method in the embodiment includes the following content.

Along the extension direction from the top surface of the substrate 10 to the bottom surface of the substrate 10, the initial sacrificial layer 220 and the third sacrificial layer 240 are partially removed through etching to form a plurality of second trenches 250 arranged at intervals along the third direction Z. The bottom of the second trench 250 exposes the top surface of the second isolation layer 100.

Then, the word line isolation structure 150 is formed in the second trench 250 by using the atomic layer deposition process, the physical vapor deposition process, or the chemical vapor deposition process.

As shown in FIGS. 26 to 30, in an embodiment, this embodiment is a further description of the foregoing step of forming the second word line structure 1320 between the first word line structure 1310 and the word line isolation structure 150. In this embodiment, the method includes the following content.

Along the extension direction from the top surface of the substrate 10 to the bottom surface of the substrate 10, the partial initial sacrificial layer 220 and third sacrificial layer 240 retained in the foregoing step are removed through etching, and a third trench 260 is formed between the sidewall of the word line isolation structure 150 and the first word line structure 1310.

Then, a second initial word line structure 1321 is formed in the third trench 260 by using the atomic layer deposition process, the physical vapor deposition process, or the chemical vapor deposition process. In the foregoing step of partially removing the initial word line structure 130*a*, the second initial word line structure 1321 is removed through etching, and the retained second initial word line structure 1321 forms the second word line structure 1320. A material of the second word line structure 1320 includes, but is not limited to, tungsten or polycrystalline silicon.

With reference to 29 to 33, in an embodiment, the first word line structure 1310 is made of titanium nitride, and the second word line structure 1320 is made of tungsten metal. After the foregoing steps, taking a plane parallel to a front-side surface of the substrate 10 along the third direction Z as a longitudinal section, the longitudinal section of the first word line structure 1310 is in a large-top and small-bottom shape. The longitudinal cross-sectional of the second word line structure 1320 is in a small-top and large-bottom shape. The lower part of the first word line structure 1310 covers the lower part of the second word line structure 1320.

In this embodiment, the word line structure 130 is formed by the first word line structure 1310 and the second word line structure 1320, which are made of different materials, thereby forming a gate structure with a dual function.

In addition, a part of the first word line structure 1310 adjacent to the third segment 203 (the source) is thicker than the part adjacent to the first segment 201 (the drain), while a part of the second word line structure 1320 adjacent to the third segment 203 (the source) is thinner than the part adjacent to the first segment 201 (the drain). The thickness of the first word line structure 1310 made of titanium nitride material affects the potential.

Therefore, when a transistor formed by the semiconductor structure in this embodiment, such as a GAA transistor, is used, the potential of the word line structure 130 adjacent to the third segment 203 at the gate is larger than that of the word line structure 130 adjacent to the first segment 201, resulting in an increase in the turn-on voltage VT applied to the terminal of the gate close to the source, which increases a source voltage Vs at the terminal of source. A relationship shown in the following formula exists between the turn-off current (I off) and the source voltage Vs, namely:

$$I\text{ off} \partial e^{-(V_s * \varepsilon/kt)}$$

where, ε/kt represents a constant, which is about 0.0256. Therefore, if the source voltage Vs of the source increases, the turn-off current (I off) decreases. Because the turn-off current and the source voltage Vs satisfy the exponential relationship of e, when the potential of the terminal of the gate adjacent to the source is higher than that of the terminal adjacent to the drain, the turn-off current decreases exponentially, to facilitate the control of the turn-off current of the semiconductor structure, thereby reducing the GIDL current and inter-band tunneling of the semiconductor structure and improving the performance and the yield of the semiconductor structure.

Figure 34:
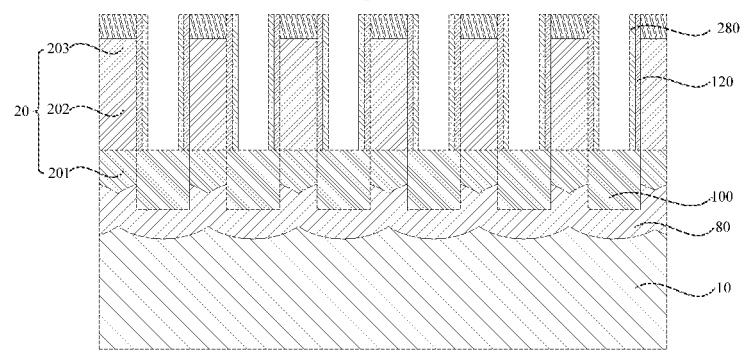
FIG. 34 is a schematic diagram of forming a third initial word line along the direction Z in the manufacturing method of a semiconductor structure according to an exemplary embodiment.
Figure 35:
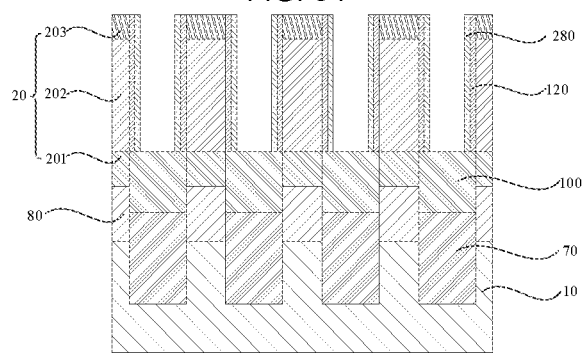
FIG. 35 is a schematic diagram of forming the third initial word line along the direction Z in the manufacturing method of a semiconductor structure according to an exemplary embodiment.

As shown in FIGS. 34 and 35, in some other embodiments, the word line structure 130 may be formed on the sidewall of the gate oxide layer 120 by using the following method.

After the gate oxide layer 120 is formed, the gate oxide layer 120 located on the top surface of the active pillar 20 is removed through etching, and a third filling region is formed between the top surface of the second isolation layer 100 and the retained gate oxide layer 120.

A third initial word line 270 is formed in the third filling region by using the atomic layer deposition process, the physical vapor deposition process, or the chemical vapor deposition process. Along the extension direction from the top surface of the substrate 10 to the bottom surface of the substrate 10, the third initial word line 270 is partially removed through etching, to expose top surfaces of the second isolation layer 100 and the active pillar 20, and the third initial word line 270 on the sidewall of the gate oxide layer 120 is retained.

A fourth filling region is formed between the adjacent third initial word lines 270, and then the word line structure 130 and the word line isolation structure 150 are formed subsequently in the fourth filling region. With reference to some steps in the step S300, the word line structures 130 and the word line isolation structure 150 may form the semiconductor structure as shown in FIGS. 32 and 33.

In this embodiment, the third initial word line 270 is partially removed through etching, to form a third word line. The third word line and the second word line 131b in the foregoing embodiment form the word line structure 130 of this embodiment. It should be noted that, the third word line in this embodiment is equivalent to the first word line 131a in the foregoing embodiment.

Compared to the foregoing embodiments, in this embodiment, the third initial word line 270 is formed, and then is partially removed, to cut off it along the second direction Y and the third direction Z, thereby simplifying process steps of manufacturing the semiconductor structure. Such a process is simple and easy to control, and effectively reduces the process costs of the semiconductor structure.

As shown in FIGS. 32 and 33, an exemplary embodiment of the present disclosure provides a semiconductor structure. The semiconductor structure includes a substrate 10, an active pillar 20, a gate oxide layer 120, and a word line structure 130.

For example, a plurality of active pillars 20 are provided and arranged as an array on the substrate 10. Along a first direction X, the active pillar 20 includes a first segment 201, a second segment 202, and a third segment 203 that are sequentially connected. The first segment 201 is connected to the substrate 10. The first segment 201 may form the drain of the active pillar 20. The second segment 202 may form the channel region. The third segment 203 may form the source.

The gate oxide layer 120 is disposed on sidewalls of each of the second segment 202 and the third segment 203.

The word line structure 130 includes a first word line structure 1310 and a second word line structure 1320. The first word line structure 1310 is connected to the sidewall of the gate oxide layer 120. The first word line structure 1310 partially covers the second word line structure 1320. The first word line structure 1310 and the second word line structure 1320 are made of different materials.

In this embodiment, the gate oxide layer 120 is formed on the second segment 202 and the third segment 203 of the active pillar 20. The word line structure 130 is formed on the sidewall of the gate oxide layer 120 and includes the first word line structure 1310 and the second word line structure 1320, which are made of different materials. Therefore, when the semiconductor structure is used, the first word line structure 1310 and the second word line structure 1320 have different potentials, which is beneficial to controlling the turn-off current of the semiconductor structure, and reducing the problems of GIDL and inter-band tunneling, thereby effectively improving the performance and yield of the semiconductor structure.

With reference to FIGS. 32 and 33, in some embodiments, the first word line structure 1310 includes a first word line 131a and a second word line 131b. The first word line 131a is disposed on the sidewall of the gate oxide layer 120, and the second word line 131b is disposed on the sidewall of the first word line 131a. Along the first direction X, the first word line 131a is longer than the second word line 131b, and the second word line 131b is close to the third segment 203.

The second word line structure 1320 is disposed on the sidewalls of each of the first word line 131a and the second word line 131b. A third isolation layer 170 is disposed on the top surface of the second word line structure 1320 and the top surface of the first word line structure 1310.

Therefore, through the design of the word line structure 130, taking a plane parallel to a front-side surface of the substrate 10 along the third direction Z as a longitudinal section, in the semiconductor structure, the longitudinal section of the first word line structure 1310 is in a large-top and small-bottom shape. The longitudinal cross-sectional of the second word line structure 1320 is in a small-top and large-bottom shape. In some embodiments, the material of the first word line structure 1310 includes, but is not limited to, titanium nitride, and the material of the second word line structure 1320 includes, but is not limited to, tungsten or polysilicon. The thickness of the first word line structure 1310 made of titanium nitride affects the potential when the semiconductor structure is used subsequently. Therefore, when the semiconductor structure is used, the first word line structure 1310 and the second word line structure 1320 generate different potentials. As a result, a potential at the word line structure 130 of the second segment 202 of the active pillar 20 adjacent to the third segment 203 is larger than that at the word line structure 130 adjacent to the first segment 201, which is beneficial to controlling the turn-off current of the semiconductor structure, and reducing the problems of GIDL and inter-band tunneling, thereby effectively improving the performance and yield of the semiconductor structure.

With reference to FIGS. 32 and 33, in some embodiments, the semiconductor structure further includes a plurality of bit lines 80 arranged at intervals along the second direction Y. The bit line 80 is located below the active pillars 20.

With reference to FIGS. 32 and 33, in some embodiments, the semiconductor structure further includes a word line isolation structure 150 and a bit line isolation structure 110.

The word line isolation structures 150 are arranged at intervals along the third direction Z and each located between adjacent word line structures 130, to insulate them.

The bit line isolation structures 110 are arranged at intervals along the second direction Y and each located between adjacent bit lines 80, to insulate them. It should be noted that, in some embodiments, the bit line isolation structure 110 includes a first isolation layer 70 and a second isolation layer 100. Along the first direction X, the first isolation layer 70 is located between the second isolation layer 100 and the substrate 10. The top surface of the second isolation layer 100 is flush with the junction between the first segment 201 and the second segment 202.

The embodiments or implementations of this specification are described in a progressive manner, and each embodiment focuses on differences from other embodiments. The same or similar parts between the embodiments may refer to each other.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A manufacturing method of a semiconductor structure, comprising:
    providing a substrate;
    forming active pillars on the substrate, wherein the active pillars are arranged in an array, and the active pillar comprises a first segment, a second segment, and a third segment that are connected sequentially along a first direction;
    forming a gate oxide layer on the second segment and the third segment; and
    forming a word line structure on a sidewall of the gate oxide layer, wherein the word line structure comprises a first word line structure and a second word line structure that are connected sequentially along a first direction, the first word line structure is connected to the sidewall of the gate oxide layer, and partially covers the second word line structure, and the first word line structure and the second word line structure are made of different materials.

2. The manufacturing method of a semiconductor structure according to claim 1, the manufacturing method further comprises:
    forming silicon pillars on the substrate, wherein the silicon pillars are arranged in an array, a plane perpendicular to the first direction is used as a cross section, and a cross-sectional shape of the silicon pillar comprises a square; and
    pre-processing the silicon pillar to form the active pillar, wherein a cross-sectional shape of the active pillar comprises a circle and/or an ellipse.

3. The manufacturing method of a semiconductor structure according to claim 2, wherein the pre-processing the silicon pillar to form the active pillar comprises:
    oxidizing the silicon pillar.

4. The manufacturing method of a semiconductor structure according to claim 2, wherein the forming silicon pillars on the substrate, wherein the silicon pillars are arranged in an array comprises:
    forming a plurality of bit line isolation trenches in the substrate, wherein the plurality of bit line isolation trenches are arranged at intervals along a second direction, and the substrate between adjacent two of the bit line isolation trenches forms a strip body; and
    forming a plurality of word line isolation trenches in the substrate, wherein the plurality of word line isolation trenches are arranged at intervals along a third direction, to divide the strip body into the plurality of silicon pillars, and along the first direction, the word line isolation trench is shallower than the bit line isolation trench.

5. The manufacturing method of a semiconductor structure according to claim 4, the manufacturing method further comprises:
    forming a first isolation layer in the bit line isolation trench, wherein a top surface of the first isolation layer is flush with a bottom surface of the word line isolation trench; and
    implanting ions into the word line isolation trench, to form a bit line at a bottom of the first segment, wherein the bit lines are arranged at intervals along the second direction.

6. The manufacturing method of a semiconductor structure according to claim 5, the manufacturing method further comprises:
    forming a second initial isolation layer on the first isolation layer; and partially removing the second initial isolation layer along the first direction, wherein the retained second initial isolation layer forms a second isolation layer; and the first isolation layer and the second isolation layer form a bit line isolation structure, and a top surface of the second isolation layer is flush with a junction between the first segment and the second segment.

7. The manufacturing method of a semiconductor structure according to claim 6, wherein the forming a gate oxide layer on the second segment and the third segment comprises:

forming the gate oxide layer on a sidewall of the second segment and on a sidewall and a top surface of the third segment by an atomic layer deposition process.

8. The manufacturing method of a semiconductor structure according to claim 7, wherein a first filling region is formed between the top surface of the second isolation layer and the sidewall of the gate oxide layer; and the forming a word line structure on a sidewall of the gate oxide layer comprises:

forming a first initial word line structure in the first filling region;

cutting off the first initial word line structures along the second direction, to form first transition word line structures arranged at intervals along the second direction;

forming a word line isolation structure between adjacent two of the first transition word line structures along the third direction, wherein the word line isolation structures cut off the first transition word line structures to form first intermediate word line structures arranged in an array;

forming a second initial word line structure between the first intermediate word line structure and the word line isolation structure, wherein the first intermediate word line structure and the second initial word line structure form an initial word line structure;

removing the initial word line structure by a pre-determined depth, to partially expose the sidewall of the gate oxide layer, wherein the retained initial word line structure comprises the first word line structure and the second word line structure, the first word line structure and the second word line structure form the word line structure, and a top surface of the word line structure and the exposed sidewall of the gate oxide layer form a second filling region;

forming a third isolation layer in the second filling region; and processing a top surface of the third isolation layer, to expose a top surface of the active pillar.

9. The manufacturing method of a semiconductor structure according to claim 8, wherein the forming a first initial word line structure in the first filling region comprises:

forming a first initial word line in the first filling region, wherein the first initial word line extends outside the first filling region and covers the top surface of the active pillar, and a first filling sub-region is formed between the first initial word lines;

forming a first sacrificial layer in the first filling sub-region, wherein a second filling sub-region is formed between a top surface of the first sacrificial layer and a sidewall of the first initial word line;

forming a second initial word line on a sidewall of the second filling sub-region, wherein the second initial word line extends outside the second filling sub-region, and covers a top surface of the first initial word line; and forming a second sacrificial layer on the first sacrificial layer, wherein the second sacrificial layer is flush with a top surface of the second initial word line, and the first sacrificial layer and the second sacrificial layer form an initial sacrificial layer.

10. The manufacturing method of a semiconductor structure according to claim 9, wherein the cutting off the first initial word line structures along the second direction comprises:

partially removing the initial sacrificial layers and the first initial word line structures, to form first trenches arranged at intervals along the second direction, wherein a bottom surface of the first trench exposes the top surface of the second isolation layer, and the retained first initial word line structure forms the first transition word line structure; and forming a third sacrificial layer in the first trench.

11. The manufacturing method of a semiconductor structure according to claim 10, wherein the forming a word line isolation structure between adjacent two of the first transition word line structures along the third direction, wherein the word line isolation structures cut off the first transition word line structures to form first intermediate word line structures arranged in an array comprises:

partially removing the initial sacrificial layers and the third sacrificial layers, to form second trenches arranged at intervals along the third direction, wherein the second trench exposes the top surface of the second isolation layer; and forming the word line isolation structure in the second trench.

12. The manufacturing method of a semiconductor structure according to claim 11, wherein the forming a second initial word line structure between the first intermediate word line structure and the word line isolation structure comprises:

removing the retained initial sacrificial layer and third sacrificial layer, wherein a third trench is formed between a sidewall of the word line isolation structure and the first word line structure; and forming the second initial word line structure in the third trench.

\* \* \* \* \*